United States Patent
Tatami et al.

(10) Patent No.: US 9,096,921 B2
(45) Date of Patent: Aug. 4, 2015

(54) TRANSPARENT CONDUCTIVE FILM AND TOUCH PANEL

(75) Inventors: Naka Tatami, Ohsu (JP); Toshiyuki Oya, Ohtsu (JP); Hideo Murakami, Ohtsu (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 172 days.

(21) Appl. No.: 13/121,173

(22) PCT Filed: Aug. 21, 2009

(86) PCT No.: PCT/JP2009/064649
§ 371 (c)(1),
(2), (4) Date: Mar. 25, 2011

(87) PCT Pub. No.: WO2010/035598
PCT Pub. Date: Apr. 1, 2010

(65) Prior Publication Data
US 2011/0177314 A1    Jul. 21, 2011

(30) Foreign Application Priority Data

Sep. 26, 2008 (JP) ................. 2008-247940
Jun. 3, 2009 (JP) ................. 2009-134031
Jul. 23, 2009 (JP) ................. 2009-172097

(51) Int. Cl.
*C23C 14/08* (2006.01)
*C23C 14/58* (2006.01)
*H01B 1/08* (2006.01)

(52) U.S. Cl.
CPC ........... *C23C 14/086* (2013.01); *C23C 14/5806* (2013.01); *H01B 1/08* (2013.01)

(58) Field of Classification Search
CPC .... C23C 14/086; C23C 14/5806; H01B 1/08; C03C 2217/231
USPC ................ 428/212, 411.1, 220, 702
See application file for complete search history.

(56) References Cited

U.S. PATENT DOCUMENTS

| | | | |
|---|---|---|---|
| 6,617,056 B1 | 9/2003 | Hara et al. | |
| 2005/0208713 A1* | 9/2005 | Ohnishi | 438/166 |
| 2008/0020202 A1 | 1/2008 | Nashiki et al. | |
| 2008/0169122 A1* | 7/2008 | Shiraishi et al. | 174/257 |
| 2012/0052278 A1 | 3/2012 | Nashiki et al. | |

FOREIGN PATENT DOCUMENTS

| | | |
|---|---|---|
| CN | 1947204 A | 4/2007 |
| JP | 60-131711 A | 7/1985 |
| JP | 61-183809 A | 8/1986 |
| JP | 2-194943 A | 8/1990 |
| JP | 2-276630 A | 11/1990 |
| JP | 61-079647 A | 6/1994 |
| JP | 8-064034 A | 3/1996 |
| JP | 11-286078 A | 10/1999 |
| JP | 2000-144379 A | 5/2000 |
| JP | 2000-238178 A | 9/2000 |
| JP | 2004-071171 A | 3/2004 |
| JP | 2006-139750 A | 6/2006 |
| JP | 2006-202756 A | 8/2006 |
| JP | 2007-133839 A | 5/2007 |
| WO | 00-51139 | 8/2000 |

OTHER PUBLICATIONS

Nashiki et al (JP 2006-139750 machine translation), Jun. 1, 2006.*
Sasa et al (JP 2006-202756 machine translation), Aug. 3, 2006.*
Korean Patent Office, Notice of Preliminary Rejection in Korean Patent Application No. 10-2011-7006746 (Aug. 29, 2012).
Chinese Patent Office, The Second Office Action in Chinese Patent Application No. 200980137911.6 (Oct. 25, 2012).
Chinese Patent Office, First Office Action in Chinese Patent Application No. 200980137911.6 (Apr. 18, 2012).
International Search Report for PCT/JP2009/064649 dated Nov. 10, 2009.
Chinese Patent Office, Rejection Decision for Chinese Application No. 200980137911.6 (Apr. 15, 2013).
Japanese Patent Office, Notice of Reasons for Rejection for Japanese Patent Application No. 2009-134031 (Oct. 1, 2013).
Japanese Patent Office, Notice of Reasons for Rejection for Japanese Patent Application No. 2008-247940 (Jun. 18, 2013).
Korean Patent Office, Notice of Preliminary Rejection in Korean Patent Application No. 10-2012-7029912 (May 9, 2014).
Korean Patent Office, Notice of Preliminary Rejection in Korean Patent Application No. 10-2012-7029912 (Nov. 5, 2014).

* cited by examiner

*Primary Examiner* — Aaron Austin
*Assistant Examiner* — Lawrence Ferguson
(74) *Attorney, Agent, or Firm* — Leydig, Voit & Mayer, Ltd.

(57) ABSTRACT

The present invention provides a transparent conductive film excellent in pen sliding durability at the time of using the transparent conductive film for a touch panel and which enables to production a touch panel having excellent flatness. A transparent conductive film of the present invention comprises a transparent plastic film base and a transparent conductive thin film containing crystalline indium oxide as a main component laminated on at least one face of a transparent plastic film base, wherein an average circle-equivalent diameter of crystal grains of indium oxide of the transparent conductive thin film is 30 to 1000 nm, and a coefficient of variation of a circle-equivalent diameter of the crystal grains is 0.00 to 0.30. The transparent conductive film preferably contains indium oxide containing 0.5 to 8% by mass of tin oxide.

16 Claims, 2 Drawing Sheets

Example 1: Example relevant to the longest part of a crystal grain

Example 2: Example relevant to the longest part of a crystal grain

Example 3: Example relevant to the longest part of a crystal grain

Example 4: Example relevant to the longest part of a crystal grain

TRANSPARENT CONDUCTIVE FILM AND TOUCH PANEL

TECHNICAL FIELD

The present invention relates to a transparent conductive film obtained by laminating a transparent conductive thin film mainly made of crystalline indium oxide on a transparent plastic film base by a sputtering method, particularly a transparent conductive film excellent in pen sliding durability when used for a touch panel for pen input. Further, the present invention relates to a transparent conductive film which enables to give excellent flatness when used for an upper electrode of a touch panel.

BACKGROUND ART

A transparent conductive film obtained by laminating a thin film having transparency and a low resistance on a transparent plastic base has been used widely in electric and electronic fields, for example, for applications based on the conductivity, such as transparent electrodes for flat panel displays such as liquid crystal displays and electroluminescent (EL) displays, as well as touch panels.

Along with the spread of personal digital assistants and notebook personal computers with a touch panel, a touch panel more excellent in pen sliding durability than before has recently been required. At the time of inputting with a pen in a touch panel, a transparent conductive thin film in a fixed electrode side and a transparent conductive thin film in a movable electrode (film electrode) side are brought into contact with each other, and it is desired to obtain a transparent conductive film having so excellent pen sliding durability as not to cause damages such as cracks and peeling in the transparent conductive thin film with the pen load at that time.

As means for improving pen sliding durability, there are methods of making a transparent conductive thin film in a movable electrode (film electrode) side crystalline (Patent literatures 1 to 11).

However, conventional transparent conductive films have the following problems.

Patent literatures 1 to 7 disclose transparent conductive films each obtained by forming an under layer produced by hydrolysis of an organic silicon compound on a transparent plastic film base and further forming a crystalline transparent conductive thin film thereon. However, these transparent conductive films are whitened and insufficient in pen sliding durability since their transparent conductive thin films are separated after a linear sliding test carried out at 5.0 N load 300,000 times using a pen made of polyacetal described in a pen sliding durability test described below.

Patent literatures 8 to 11 disclose transparent conductive films wherein crystalline transparent conductive thin films are formed with extremely lowered water in a film formation atmosphere at the time of sputtering. However, to produce these transparent conductive films, a vacuum pump with capability of carrying out vacuum evacuation for a long time or a very high power is needed and thus it is not suitable for industrial applications. Furthermore, the transparent conductive film of Patent literature 11 is whitened and insufficient in pen sliding durability since its transparent conductive thin film is separated after a linear sliding test carried out at 5.0 N load 300,000 times using a pen made of polyacetal described in a pen sliding durability test described below.

Moreover, conventional transparent conductive films each obtained by forming a crystalline transparent conductive thin film are subjected to heat treatment for crystallization, and therefore, the residual strains of the transparent films as bases are moderated to provide transparent conductive films with a low heat shrinkage ratio, and it results in another problem of impossibility of obtaining good flatness by properly shrinking the transparent conductive films by heat treatment when the transparent conductive films are to be used as an upper electrode of a large scale touch panel with a size exceeding 10 inches.

CITATION LIST

Patent Literature

PTL 1: Japanese published unexamined application No. S60-131711
PTL 2: Japanese published unexamined application No. S61-79647
PTL 3: Japanese published unexamined application No. S61-183809
PTL 4: Japanese published unexamined application No. H2-194943
PTL 5: Japanese published unexamined application No. H2-276630
PTL 6: Japanese published unexamined application No. H8-64034
PTL 7: Japanese published unexamined application No. H11-286078
PTL 8: Japanese published unexamined application No. 2000-144379
PTL 9: Japanese published unexamined application No. 2000-238178
PTL 10: Japanese published unexamined application No. 2004-71171
PTL 11: International Publication WO2000/051139

DISCLOSURE OF THE INVENTION

Problems to be Solved by the Invention

In view of the above-mentioned conventional problems, an object of the invention is to provide a transparent conductive film excellent in pen sliding durability at the time of using the transparent conductive film for a touch panel, particularly a transparent conductive film of which a transparent conductive thin film is not damaged even after a linear sliding test carried out at 5.0 N load 300,000 times using a pen made of polyacetal, by industrially applicable means. Further, another object is to provide a transparent conductive film which can be finished with good flatness by properly shrinking the transparent conductive film by heat treatment, when the transparent conductive film is used for an upper electrode of a large scale touch panel by providing the transparent conductive film with a proper heat shrinkage ratio.

Solution to the Problems

The present invention has been completed in view of such circumstances and a transparent conductive film of the present invention which can solve the above-mentioned problems is configured as follows;

1. A transparent conductive film obtained by laminating a transparent conductive thin film containing crystalline indium oxide as a main component on at least one face of a transparent plastic film base, wherein an average circle-equivalent diameter of crystal grains of indium oxide of the transparent conductive thin film is 30 to 1000 nm and a coefficient of variation of a circle-equivalent diameter of the crystal grains is 0.00 to 0.30.

2. A transparent conductive film obtained by laminating a transparent conductive thin film containing crystalline indium oxide as a main component on at least one face of a transparent plastic film base, wherein a long diameter of crystal grains of indium oxide of the transparent conductive thin film is 30 to 1000 nm and a ratio of an amorphous part to a crystalline part of the transparent conductive thin film is 0.00 to 0.50.
3. A transparent conductive film obtained by laminating a transparent conductive thin film containing indium oxide as a main component on at least one face of a transparent plastic film base, wherein a shrinkage ratio of the transparent conductive film at 120° C. for 60 minutes in at least one direction is 0.20 to 0.70%, an average circle-equivalent diameter of crystal grains of indium oxide of the transparent conductive thin film after heat treatment at 120° C. for 60 minutes is 30 to 1000 nm, and a ratio of an amorphous part to a crystalline part of the transparent conductive thin film is 0.00 to 0.50.
4. The transparent conductive film as described in 3, wherein a shrinkage ratio HMD at 120° C. for 60 minutes in a machine direction of the transparent conductive film and a shrinkage ratio HTD at 120° C. for 60 minutes in a traverse (width) direction of the transparent conductive film satisfy the formula (1):

$$0.00\% \leq |HMD-HTD| \leq 0.30\% \quad (1).$$

5. The transparent conductive film as described in 3 or 4, wherein a coefficient of variation of a circle-equivalent diameter of crystal grains of indium oxide of the transparent conductive thin film after heat treatment at 120° C. for 60 minutes is 0.00 to 0.30.
6. A transparent conductive film obtained by laminating a transparent conductive thin film containing indium oxide as a main component on at least one face of a base made of a multilayer film obtained by forming a curable resin cured layer on at least one face of a transparent plastic film, wherein a shrinkage ratio of the transparent conductive film at 120° C. for 60 minutes in at least one direction is 0.20 to 0.70%, an average circle-equivalent diameter of crystal grains of indium oxide of the transparent conductive thin film after heat treatment at 120° C. for 60 minutes is 30 to 1000 nm, and a ratio of an amorphous part to a crystalline part of the transparent conductive thin film is 0.00 to 0.50.
7. The transparent conductive film as described in 6, wherein the curable resin is an ultraviolet-curable resin.
8. The transparent conductive film as described in 1 to 7, wherein the transparent conductive thin film contains indium oxide as a main component and 0.5 to 8% by mass of tin oxide.
9. The transparent conductive film as described in any of 1 to 8, wherein a thickness of the transparent conductive thin film is 10 to 200 nm.
10. A touch panel using the transparent conductive film as described in any of 1 to 9 as a film in a movable electrode side.

Effects of the Invention

As described above, according to the present invention, a transparent conductive film having very excellent pen sliding durability can be produced by controlling a diameter of crystal grains of indium oxide of a transparent conductive thin film, a ratio of a crystalline part/an amorphous part and a coefficient of variation of the diameter of crystal grains after heat treatment at 120° C. for 60 minutes when the transparent conductive thin film is to be formed on at least one face of a transparent plastic film base. Further, since the transparent conductive film is provided with a proper heat shrinkability, use of the obtained transparent conductive film makes it possible to produce a touch panel for pen input with excellent pen sliding durability and good flatness.

MODE FOR CARRYING OUT THE INVENTION

Figure 1:
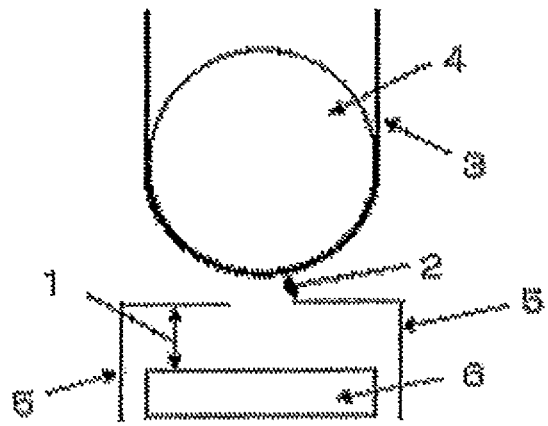
FIG. 1 A layout drawing of a film, a cathode, and an "anode closest to a film" described in the method (1) for obtaining a transparent conductive film of the present invention.
Figure 2:
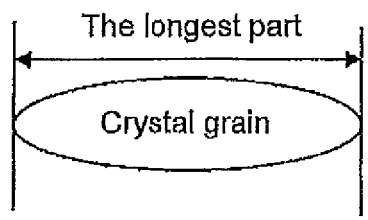
FIG. 2 A drawing showing an example (No. 1) relevant to the longest part of crystal grains of the present invention.
Figure 3:
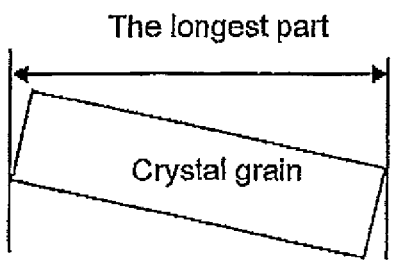
FIG. 3 A drawing showing an example (No. 2) relevant to the longest part of crystal grains of the present invention.
Figure 4:
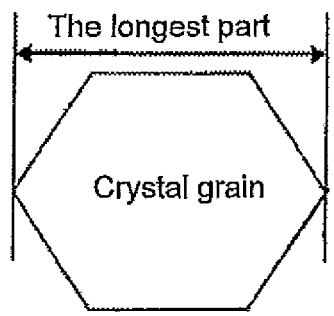
FIG. 4 A drawing showing an example (No. 3) relevant to the longest part of crystal grains of the present invention.
Figure 5:
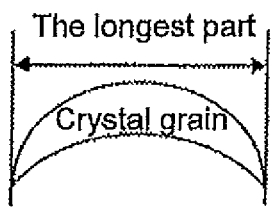
FIG. 5 A drawing showing an example (No. 4) relevant to the longest part of crystal grains of the present invention.

<Crystalline Morphology and Characteristic of Indium Oxide of Transparent Conductive Thin Film>

A transparent conductive film of the invention is a transparent conductive film obtained by laminating a transparent conductive thin film containing mainly crystalline indium oxide on at least one face of a transparent plastic film base, wherein an average circle-equivalent diameter of crystal grains of indium oxide of the transparent conductive thin film is 30 to 1000 nm and a coefficient of variation of a circle-equivalent diameter of the crystal grains is 0.00 to 0.30.

Further, another aspect of the transparent conductive film of the invention is a transparent conductive film obtained by laminating a transparent conductive thin film containing mainly crystalline indium oxide on at least one face of a transparent plastic film base, wherein a long diameter of crystal grains of indium oxide of the transparent conductive thin film is 30 to 1000 nm and a ratio of an amorphous part to a crystalline part of the transparent conductive thin film is 0.00 to 0.50.

Herein, the circle-equivalent diameter and the long diameter of crystal grains of indium oxide of the transparent conductive thin film are defined as follows.

Polygonal regions in the transparent conductive thin film layer observed with a transmission electron microscope are defined as crystal grains of indium oxide. With respect to all of the crystal grains of indium oxide observed in the transparent conductive thin film layer with a transmission electron microscope, a value calculated by measuring an area of the crystal grain, dividing the area by the circular constant $\pi$, and doubling a square root of the obtained value is defined as a circle-equivalent diameter; and a value calculated by dividing the standard deviation of the circle-equivalent diameter by an average circle-equivalent diameter is defined as a coefficient of variation of the circle-equivalent diameter. Further, the longest parts of all of the crystal grains are measured and an average value of the measured values is defined as a long diameter of the crystal grains. Herein, FIGS. 2 to 5 show examples relevant to the longest part of the crystal grain.

Moreover, the ratio of the amorphous part to the crystalline part of indium oxide of the transparent conductive thin film is calculated from an area ratio of a crystalline part and an amorphous part which are observed with a transmission electron microscope. In this connection, when a transparent conductive thin film layer is observed with a transmission electron microscope, those having polygonal regions are defined as a crystalline part of indium oxide of the transparent conductive thin film and the remaining part is defined as an amorphous part thereof.

The average circle-equivalent diameter or the long diameter of crystal grains of indium oxide of the transparent conductive thin film composing the transparent conductive film of the invention is 30 to 1000 nm. It is particularly preferably 35 to 800 nm. If the average circle-equivalent diameter or the long diameter of crystal grains is less than 30 nm, since the bonding force between the crystal grains is weak, the pen sliding durability is deteriorated. Contrarily, if the average circle-equivalent diameter or the long diameter of crystal grains exceeds 1000 nm, the bending resistance is deteriorated, the flexibility is thus lowered and the meaning of formation of the transparent conductive thin film on a plastic film base is significantly deviated and the transparent conductive thin film sometimes becomes unsuitable for use as an upper part electrode of a touch panel.

The coefficient of variation of a circle-equivalent diameter of crystal grains of indium oxide of the transparent conductive thin film composing the transparent conductive film of the invention is 0.00 to 0.30. It is particularly preferably 0.00 to 0.25. If the coefficient of variation of a circle-equivalent diameter of crystal grains is 0.00 to 0.30, the force which the transparent conductive thin film receives from a pen at the time of sliding the pen becomes even and therefore, occurrence of cracking or whitening can be suppressed. If the coefficient of variation of a circle-equivalent diameter of crystal grains is more than 0.30, a variation of a crystal grain size becomes wide and the transparent conductive thin film receives the force from a pen unevenly and cracking and whitening occur from the point where a high pressure is applied by the pen. When the sliding of the pen is continued, the entire pen sliding part is worsened from the point having cracking and whitening as a starting point. Since the evenness of a crystal grain diameter of indium oxide is preferable, the coefficient of variation is preferably zero; however, in terms of stable production, the coefficient of variation is more preferably 0.05 or more.

The ratio of the amorphous part to the crystalline part of indium oxide of the transparent conductive thin film in the invention is 0.00 to 0.50 and preferably 0.00 to 0.45. If the ratio is more than 0.50, the crystal grains are in a state that they float like islands in the amorphous part. In such a state, when a pen sliding durability test is carried out, the amorphous part is at first separated and the crystal grains are separated from the part, where the amorphous part was separated, to break the transparent conductive thin film.

If the ratio is 0.50 or less, the crystal grains are not in such a state that the crystal grains float like islands in the amorphous part but in a state that the crystal grains are all bonded. In such a state, even if the pen sliding durability test is carried out, the crystal grains are supported with one another, and therefore, very high pen sliding durability can be obtained.

The transparent conductive thin film composing the transparent conductive film of the invention is preferable to contain indium oxide as a main component and 0.5 to 8% by mass of tin oxide. Tin oxide is equivalent to impurity addition to indium oxide. Impurity addition of tin oxide increases the melting point of indium oxide containing tin oxide. That is, impurity addition of tin oxide works toward inhibition of crystallization. It is desirable to add 0.5 to 8% by mass of tin oxide. If addition of tin oxide is less than 0.5%, crystallization occurs; however the surface resistance becomes higher than a level for practical use and therefore, it is not desirable. In the case addition of tin oxide is more than 8% by mass, crystallization becomes difficult and pen sliding durability is deteriorated. The surface resistance of the transparent conductive film of the invention is preferably 10 to 1000 $\Omega/\square$.

The thickness of the transparent conductive thin film composing the transparent conductive film of the invention is desirably 10 to 200 nm. If the thickness of the transparent conductive thin film is less than 10 nm, the film becomes uneven and therefore the pen sliding durability becomes weak. On the other hand, if the thickness of the transparent conductive thin film becomes more than 200 nm, the total light transmittance is lower than a level for practical use and therefore, it is not desirable. The total light transmittance of the transparent conductive film of the invention is preferably 60 to 95%.

In the invention, the thickness of the transparent conductive thin film is desirably 10 to 200 nm. If the thickness of the transparent conductive thin film is less than 10 nm, the film becomes uneven and therefore the pen sliding durability becomes weak. On the other hand, if the thickness of the transparent conductive thin film becomes more than 200 nm, the total light transmittance is lower than a level for practical use and therefore, it is not desirable.

<Film Formation Method of Transparent Conductive Thin Film of Transparent Conductive Film>

In order to obtain the transparent conductive film of the invention, the following parameters are important.

In a method of forming a transparent conductive thin film mainly containing crystalline indium oxide on at least one face of a transparent plastic film base, it is desirable to carry out the film formation of the transparent conductive thin film on the transparent plastic film while controlling a partial pressure ratio of a gas with a mass number of 28 to an inert gas in a film formation atmosphere at the time of sputtering to be $50 \times 10^{-4}$ to $50 \times 10^{-2}$ and a film temperature to be 80° C. during the film formation. In order to control the partial pressure ratio of a gas with a mass number of 28 to an inert gas in the film formation atmosphere at the time of sputtering to be $50 \times 10^{-4}$ or less, a vacuum pump with a very high power is required and it becomes difficult to carry out the film formation economically.

The gas with a mass number of 28 in the film formation atmosphere is mainly carbon monoxide and nitrogen. Particularly, a carbon monoxide gas is emitted much when the transparent conductive thin film is formed on the film. The gas with a mass number of 28 is emitted by plasma decomposition of organic components mainly contained in the film. Since a very large quantity of organic components volatilizes at the time of formation of the transparent conductive thin film, crystal grains of the transparent conductive thin film tend to be uneven. Decrease of the volatilization amount of the organic components leads to improvement of evenness of the crystal grains of the transparent conductive thin film. The volatilization amount of the organic components may be determined by observing the gas with a mass number of 28. It is found in the invention that the crystal grains of the transparent conductive thin film can be even and the transparent conductive thin film with excellent pen sliding durability can be formed by controlling the partial pressure ratio of a gas with a mass number of 28 to an inert gas in the film formation atmosphere at the time of sputtering to be $50 \times 10^{-4}$ to $50 \times 10^{-2}$.

In order to obtain the transparent conductive film of the invention, the following methods (1), (2), (3), and (4) are desirable.

(1) To form a transparent conductive film by laminating a transparent conductive thin film mainly containing crystal grains of indium oxide with high evenness on at least one face of a transparent plastic film base, it is desirable that a ratio of a distance between the film and an "anode closest to the film" (excluding rolls on which the film is moved) to a distance between a cathode and the "anode closest to the film" is 0.07 or more. Refer to FIG. 1 regarding the arrangement of the film, the cathode, and the "anode closest to the film". If the ratio of the distance between the film and the "anode closest to the film" to the distance between the cathode and the "anode closest to the film" is less than 0.07, ion irradiation quantity to the film is increased and therefore, the organic components much volatilize from the film and even crystal grain formation is inhibited.

(2) To form a transparent conductive film by laminating a transparent conductive thin film mainly containing crystal grains of indium oxide with high evenness on at least one face of a transparent plastic film base, it is desirable that the film is difficult to be firmly wound in a vacuum state. Specifically, it is desirable to stick a protection film to the film, to knurl the film, and to wind the film with a force as weak as 50 to 100 N/m. However, if the film is wound at less than 50 N/m, the winding is misaligned when the film is conveyed, and therefore it is not suitable. If the film is firmly wound, the points from which the organic components escape are lessened and a large quantity of organic components volatilize from the film when the transparent conductive thin film is formed and therefore, the crystal grains of the transparent conductive thin film become uneven.

(3) To form a transparent conductive film by laminating a transparent conductive thin film mainly containing crystal grains of indium oxide with high evenness on at least one face of a transparent plastic film base, it is desirable that the film is passed to a bombard step before formation of the transparent conductive thin film. The bombard step is to carry out electric discharge by voltage application and generate plasma in a state that only an inert gas such as an argon gas or a gas mixture of a reactive gas such as oxygen and an inert gas is kept flowing. Specifically, it is desirable that the film is bombarded by RF sputtering using a SUS target or the like. Since the film is exposed to plasma by the bombard step, organic components volatilize from the film and the amount of the organic components volatilizing from the film when the transparent conductive thin film is to be formed are decreased. Thus the evenness of the crystal grain size of the transparent conductive thin film can be enhanced and the pen sliding durability can be improved.

(4) To form a transparent conductive film by laminating a transparent conductive thin film mainly containing crystal grains of indium oxide with high evenness on at least one face of a transparent plastic film base, it is desirable that the film is used after heated before formation of the transparent conductive thin film. Specifically, it is desired that the film is heated off-line by a drier or the like, or that the film is heated in-line by an IR heater or the like. Since organic components can volatilize by heating the film, the volatilization amount of the organic components can be decreased when the transparent conductive thin film is to be formed. Therefore, the evenness of the crystal grain size of the transparent conductive thin film can be increased and the pen sliding durability can be improved.

Further, it is desirable that the base temperature is kept 80° C. or less during film formation and that the transparent conductive thin film is formed on the base. If it is kept 80° C. or more, a large quantity of the organic components are emitted from the film, formation of the transparent conductive thin film containing even crystal grains, that is, formation of the transparent conductive thin film excellent in pen sliding durability, is inhibited.

Furthermore, in order to control the long diameter of crystal grains of indium oxide of the transparent conductive thin film to be 30 to 1000 nm and the ratio of the amorphous part to the crystalline part of the transparent conductive thin film, the following methods (1), (2), and (3) are desirable.

(1) In a method of forming a transparent conductive thin film mainly containing crystalline indium oxide on at least one face of a transparent plastic film base, it is desirable to form the transparent conductive thin film on the transparent plastic film while controlling a partial pressure ratio of water to an inert gas in the film formation atmosphere at the time of sputtering to be $8.0 \times 10^{-4}$ to $3.0 \times 10^{-3}$ Pa and a partial pressure ratio of oxygen to the inert gas to be $8.0 \times 10^{-3}$ to $30 \times 10^{-3}$ Pa and also keeping the film temperature 80° C. or less during the film formation.

It is known that if water is contained in a film formation atmosphere, crystallization of a transparent conductive thin film is inhibited. Therefore, the water amount in the film formation atmosphere is an important factor. In order to control the water amount at the time of film formation on a plastic film, it is desirable to observe the water amount at the time of actual film formation. It is not suitable to use aimed vacuum degree for the control of the water amount in the film formation atmosphere because of the following two points.

Firstly, if film formation on a plastic film is carried out by sputtering, the film is heated and the water amount in the film formation atmosphere is increased beyond the water amount measured at the time of measuring the aimed vacuum degree.

Secondarily, it is a case in an apparatus to which a large quantity of a transparent plastic film is loaded. The film is loaded in form of a roll to such an apparatus. When the film is loaded in form of a roll to a vacuum chamber, water tends to escape from the outer surface of the roll; however water hardly escape from the inner part of the roll in which the film are piled by winding the film. When the aimed vacuum degree is measured, the film roll is stopped; however the film is run at the time of film formation and therefore the inner part of the roll containing a high quantity of water is wound out from the roll and thus the water amount in the film formation atmosphere is increased beyond the water amount measured at the time of measuring the aimed vacuum degree. In the invention, in order to control the water amount in the film formation atmosphere, the partial pressure ratio of water to an inert gas in the film formation atmosphere at the time of sputtering is observed to deal with this matter.

The partial pressure ratio of water to an inert gas in the film formation atmosphere at the time of sputtering is more desirable as it is lower; however in a case of an apparatus in which a large quantity of the transparent plastic film is loaded to a film formation chamber, it is needed to carry out vacuum evacuation for a long time to adjust the partial pressure ratio of water to an inert gas to be $2.5 \times 10^{-6}$ to $7.0 \times 10^{-4}$ as described in PTL 11, or a very high power vacuum pump is needed, and economical execution is thus difficult.

The inventions have found a production method of a transparent conductive thin film having a crystalline part and very excellent pen sliding durability even in a case of using an apparatus in which a large quantity of transparent plastic films are loaded to a film formation chamber, or even at a partial pressure ratio of water to an inert gas easy to be achieved actually. As the partial pressure ratio of water to an inert gas, it is actually easy to control the ratio to be $8.0 \times 10^{-4}$ to $3.0 \times 10^{-3}$. If film formation is carried out in the state while controlling the oxygen partial pressure to be $8.0 \times 10^{-3}$ to $30 \times 10^{-3}$ Pa, it is made possible to obtain a transparent conductive thin film having a crystalline part and to obtain a transparent conductive film very excellent in pen sliding durability.

The above-mentioned range of the oxygen partial pressure is considerably particular. In general, the transparent conductive thin film is produced in an oxygen partial pressure in which the resistance becomes lowest; however in the invention, film formation is carried out in an oxygen partial pressure higher than the oxygen partial pressure in which the resistance becomes lowest.

The intent of controlling the oxygen partial pressure to be the higher value is as follows. When film formation is carried out in a condition of a high oxygen partial pressure, oxygen defect parts of indium oxide are compensated and therefore, a film with a very stabilized crystal structure in terms of energy can be obtained.

As a result, the probability of generation of crystal grains on a transparent plastic base is increased and further the crystal growth becomes easy, so that the very excellent pen sliding durability can be exhibited. However, if the oxygen partial pressure is increased more than $30 \times 10^{-3}$ Pa, the surface resistance exceeds a practically usable level and therefore, it is not desirable. Herein, the practically usable level of the surface resistance is about 50 to 1000 Ω/□.

Moreover, it is desirable to form the transparent conductive thin film on a base while keeping the base temperature 80° C. or less during the film formation. If it is 80° C. or more, a large quantity of impurity gases such as water and an organic gas from the film is generated and therefore, formation of the transparent conductive thin film having a crystalline part, that is, the transparent conductive thin film excellent in pen sliding durability, is inhibited.

(2) To form a transparent conductive thin film mainly containing crystalline indium oxide on at least one face of a transparent plastic film base, it is desirable to form the transparent conductive thin film on the film by employing an activation-assisting method such as an ion-assist method or an ion plating method, as well as a high power impulse magnetron sputtering method. In order to form crystal grains, energy which evaporated atoms have is needed.

Since the energy which the evaporated atoms have is higher than that in a common film formation means, the above-mentioned method can increase the probability of generation of crystal grains and make the crystal growth easy. Therefore, very excellent pen sliding durability can be exhibited. It is desirable to control the film formation in a condition of introducing oxygen at $4.0 \times 10^{-3}$ to $6.0 \times 10^{-3}$ Pa, thereafter introducing argon to adjust the film formation pressure at 0.15 Pa, and then carrying out arc electric discharge at a discharge voltage of 80 V, a Haas potential of +40 V, and a discharge electric current of 120 A.

(3) In the case of formation of a transparent conductive thin film mainly containing crystalline indium oxide on at least one face of a transparent plastic film base by a sputtering method or the like, it is desirable to apply a coat layer, which contains fine particles with a diameter of 20 to 500 nm and having the same composition as that of the transparent conductive thin film, to the side where the transparent conductive thin film is to be formed. Since the fine particles become nuclei of the crystal growth of the transparent conductive thin film, the growth of the crystal grains is promoted and the very excellent pen sliding durability can be exhibited. The fine particles with a diameter less than 20 nm are hard to be produced and be available.

On the other hand, if fine particles with a diameter more than 500 nm are used, the crystal grains are grown to be too large and therefore, projections tend to be formed easily when the transparent conductive thin film is formed. The crystal grains may also be separated from the projections and the transparent conductive thin film may possibly be broken. The fine particles are desirably used while being dispersed in a curable resin cured layer or the like which is to be applied on the transparent plastic film. In this connection, it is desirable to add 1 to 30% by mass of the fine particles to the total of the organic components of the curable resin cured layer or the like.

<Transparent Conductive Film to Obtain Touch Panel Excellent in Flatness>

One aspect of the transparent conductive film of the invention is a transparent conductive film obtained by laminating a transparent conductive thin film containing crystalline indium oxide as a main component on at least one face of a transparent plastic film base, in which an average circle-equivalent diameter of crystal grains of indium oxide of the transparent conductive thin film is 30 to 1000 nm, a ratio of an amorphous part to a crystalline part of the transparent conductive thin film is 0.00 to 0.50, and a shrinkage ratio of the transparent conductive thin film at 120° C. for 60 minutes in at least one direction is 0.20 to 0.70%.

Further, a shrinkage ratio $H_{MD}$ at 120° C. for 60 minutes in a machine direction of the transparent conductive film and a shrinkage ratio $H_{TD}$ at 120° C. for 60 minutes in a traverse direction of the transparent conductive film satisfy the formula (1):

$$0.00\% \le |H_{MD} - H_{TD}| \le 0.30\% \qquad (1).$$

A coefficient of variation of a circle-equivalent diameter of crystal grains of indium oxide of the transparent conductive thin film of the transparent conductive film is more preferably 0.00 to 0.30.

That is, because of having proper shrinkability, the transparent conductive film of the invention can be shrunk properly by heat treatment at the time of using the film for an upper electrode of a touch panel and be finished to have good flatness.

A transparent conductive film obtained by laminating a usual transparent conductive thin film mainly containing crystalline indium oxide by a sputtering method has to be subjected to heat treatment at about 150° C. for crystallization treatment and therefore, it has no heat shrinkability: on the other hand, with respect to the transparent conductive film of the invention, the residual strains of the transparent film as a base are not moderated and thus a transparent conductive film keeping heat shrinkability can be obtained. Consequently, it is made possible to finish the film having good flatness by proper shrinkage by heat treatment when the film is to be used for an upper electrode of a touch panel. That is, it is preferable that the shrinkage ratio of the transparent conductive film at 120° C. for 60 minutes in at least one direction is 0.20 to 0.70%. The shrinkage ratio is more preferably in a range of 0.25 to 0.65% and even more preferable in a range of 0.30 to 0.50%.

Further, the shrinkage ratio $H_{MD}$ at 120° C. for 60 minutes in a machine direction of the transparent conductive film and the shrinkage ratio $H_{TD}$ at 120° C. for 60 minutes in a traverse direction of the transparent conductive film are preferable to satisfy the formula (1):

$$0.00\% \le |H_{MD} - H_{TD}| \le 0.30\% \qquad (1).$$

In the case the transparent conductive film of the invention is properly shrunk by heat treatment and finished to have good flatness at the time of using the film for an upper electrode of a touch panel, if the difference of the heat shrinkability is large in accordance with the directions, it is difficult to obtain a touch panel with good flatness even by heat treatment. Accordingly, the difference of the shrinkage ratio $H_{MD}$ in a machine direction and the shrinkage ratio $H_{TD}$ in a traverse direction is preferably 0.3% or less.

<Transparent Plastic Film Base>

A transparent plastic film base to be used in the invention is a film obtained by carrying out melt extrusion or solution extrusion of an organic polymer in a film state and, if necessary, further carrying out drawing in the longitudinal direction and/or width direction, cooling and heat fixation. Examples of the organic polymer include polyethylene, polypropylene, polyethylene terephthalate, polyethylene-2,6-naphthalate, poly(propylene terephthalate), nylon 6, nylon 4, nylon 66, nylon 12, polyimides, polyamide imides, polyether sulfanes, polyether ether ketones, polycarbonates, polyarylates, cellulose propionate, polyvinyl chloride, polyvinylidene chloride, polyvinyl alcohol, polyether imides, polyphenylene sulfides, polyphenylene oxides, polystyrenes, syndiotactic polystyrenes and norbornene type polymers.

Among these organic polymers, preferable are polyethylene terephthalate, polypropylene terephthalate, polyethylene-2,6-naphthalate, syndiotactic polystyrenes, norbornene type polymers, polycarbonates, polyarylates, and the like. Further, these organic polymers may be copolymerized with a small amount of a monomer of other organic polymers or may be blended with other organic polymers.

The thickness of the transparent plastic film base to be used in the invention is preferably in a range of 10 to 300 μm and particularly preferably in a range of 70 to 260 μm. If the thickness of the plastic film is 10 μm or less, the mechanical strength is insufficient and particularly in the case of using it for a touch panel, deformation by pen input tends to be large and thus the durability tends to be insufficient. On the other hand, if the thickness exceeds 300 μm, the pen load for deforming the film tends to be high in the case of using it for a touch panel and thus it is not preferable.

The transparent plastic film to be used for the invention is preferable to have a shrinkage ratio of 0.20 to 0.70% at 120° C. for 60 minutes in at least one direction. Further, the shrinkage ratio $H_{MD}$ at 120° C. for 60 minutes in a machine direction of the transparent plastic film and the shrinkage ratio $H_{TD}$ at 120° C. for 60 minutes in a traverse direction of the transparent plastic film satisfy the formula (1):

$$0.00\% \leq |H_{MD} - H_{TD}| \leq 0.30\% \quad (1).$$

In the case of properly shrinking the film by heat treatment and finishing the film to have good flatness when it is used for an upper electrode of a touch panel, it is important to give proper shrinkability for the transparent conductive film as described above. The transparent plastic film as a base is also required to have proper heat shrinkability due to the same reason.

In addition, in the formation step of the transparent conductive thin film and the coating step of the curable resin cured layer described below, it is preferable that heat is scarcely used so as to make the heat shrinkability of the transparent plastic film to be used in the invention and the heat shrinkability of the transparent conductive film almost same.

The transparent plastic film base to be used in the invention may be obtained by subjecting the above-mentioned film to surface activation treatment such as corona discharge treatment, glow discharge treatment, flame treatment, ultraviolet radiation treatment, electron beam radiation treatment, ozone treatment, or the like to such an extent that the aims of the invention are not impaired.

It can be expected that the pen sliding durability is improved by applying a curable resin cured layer to the transparent plastic film base and forming the transparent conductive thin film on the roughened surface of the curable resin cured layer. There are caused mainly two effects. One is that the adhesive force between the transparent conductive thin film and the curable resin cured layer is increased and therefore peeling of the transparent conductive thin film by pen sliding can be prevented and the pen sliding durability can be improved. The other is that the true contact surface area of the transparent conductive thin film and a glass by pen sliding is decreased and the sliding property of the glass face and the transparent conductive thin film can be increased to result in improvement of the pen sliding durability.

Further, a curable resin cured layer may be formed on the face reverse to the face where the transparent conductive thin film is formed. In the case the transparent conductive film of the invention is used as a movable electrode of a touch panel, since input can be done by a pen or a finger, the face of the movable electrode on which no transparent conductive thin film is formed tends to be easily scratched. In order to prevent such scratches, the curable resin cured layer is useful as a hard coat layer. The curable resin cured layer will be described in detail below.

<Curable Resin Cured Layer>

The above-mentioned curable resin to be used in the invention may be a resin which is cured by energy application such as heating, ultraviolet radiation and electron beam radiation, and may include silicone resins, acrylic resins, methacrylic resins, epoxy resins, melamine resins, polyester resins and urethane resins. However, in order to obtain a laminated body with a shrinkage ratio of 0.20 to 0.70% at 120° C. for 60 minutes, it is preferable to carry out treatment at a temperature as low as possible in the step of forming the curable resin cured layer. From this viewpoint, it is preferable to use an ultraviolet curable resin as a main component.

Examples of such an ultraviolet curable resin can include polyfunctional acrylate resins such as esters of polyhydric alcohol with acrylic acid or methacrylic acid; and polyfunctional urethane acrylate resins synthesized from diisocyanates, polyhydric alcohols, and hydroxyalkyl esters of acrylic acid or methacrylic acid. If necessary, a monofunctional monomer such as vinylpyrrolidone, methyl methacrylate and styrene may be added and copolymerized to these polyfunctional resins.

Further, in order to improve the adherence between the transparent conductive thin film and the curable resin cured layer, it is efficient to carry out surface treatment of the surface of the curable resin cured layer. As concrete means, there are a discharge treatment method by radiating glow or corona discharge for increasing a carbonyl group, a carboxyl group and a hydroxyl group; and a chemical agent treatment method for treatment with an acid or an alkali for increasing a polar group such as an amino group, a hydroxyl group and a carbonyl group; and the like.

The ultraviolet curable resin is generally used while being mixed with a photopolymerization initiator. As the photopolymerization initiator, known compounds which generate radicals while absorbing ultraviolet rays can be used without any particular limit. Examples of such a photopolymerization initiator can include various kinds of benzoins, phenyl ketones and benzophenones. The addition amount of the photopolymerization initiator is preferably 1 to 5 parts by mass per 100 parts by mass of the ultraviolet curable resin.

Furthermore, in the invention, it is preferable to use a resin non-compatible with the curable resin, besides the curable resin, which is a main constituent component. Combination use of a small amount of a resin non-compatible with the curable resin of the matrix causes phase separation in the curable resin and the non-compatible resin can be dispersed in the curable resin in a particle state. Due to the dispersed particles of the non-compatible resin, the surface of the curable resin cured layer is made uneven and the surface roughness is improved in a wide region.

In the case the curable resin is the above-mentioned ultraviolet curable resin, examples of the non-compatible resin include polyester resins, polyolefin resins, polystyrene resins and polyamide resins.

In the invention, in the case an ultraviolet curable resin is used as the curable resin, which is a main constituent component of the curable resin cured layer, and a polyester resin with a high molecular weight is used as the polymer resin non-compatible with the curable resin, the mixing ratio of them is preferably 0.1 to 20 parts by mass, more preferably 0.2 to 10 parts by mass, and particularly more preferably 0.5 to 5 parts by mass of the polyester resin per 100 parts by mass of the ultraviolet curable resin.

If the mixing amount of the polyester resin is less than 0.1 parts by mass per 100 parts by mass of the ultraviolet curable resin, the projected parts formed in the surface of the curable resin cured layer tend to become small and the projected parts tend to be decreased, and thus the surface roughness is not improved and the effect to further improve the pen sliding durability is not caused, and therefore, it is not preferable. On the other hand, if the mixing amount of the polyester resin exceeds 20 parts by mass per 100 parts by mass of the ultraviolet curable resin, the strength of the curable resin cured layer is lowered and the chemical resistance tends to be deteriorated.

However, because of having a different refractive index from that of the ultraviolet curable resin, the polyester resin tends to increase the haze value of the curable resin cured layer and deteriorate the transparency and therefore, it is not preferable. Contrarily, deteriorating of the transparency by the dispersed particles of the polyester resin with a high molecular weight may positively be utilized and the polyester resin may be used as an anti-glare film having a high haze value and anti-glare function.

The above-mentioned ultraviolet curable resin, photopolymerization initiator, and polyester resin with a high molecular weight are dissolved in a solvent in common for respective components to produce a coating solution. A solvent to be used is not particularly limited, examples thereof include alcohol type solvents such as ethyl alcohol and isopropyl alcohol; ester type solvents such as ethyl acetate and butyl acetate; ether type solvents such as dibutyl ether and ethylene glycol monoethyl ether; ketone type solvents such as methyl isobutyl ketone and cyclohexanone; and aromatic hydrocarbon type solvents such as toluene, xylene and solvent naphtha, and these solvents are usable alone or as a mixture.

The concentration of the resin components in the coating solution can be selected properly in consideration of the viscosity or the like in accordance with a coating method. For example, the proportion of the total amount of the ultraviolet curable resin, photopolymerization initiator, and polyester resin with a high molecular weight in the coating solution is generally 20 to 80% by mass. Further, if necessary, the coating solution may contain other known additives, for example, a silicone type leveling agent.

In the invention, the prepared coating solution is coated to the transparent plastic film base. A coating method is not particularly limited and conventionally known methods such as a bar coating method, a gravure coating method and a reverse coating method can be employed.

The solvent contained in the coated coating solution is evaporated and removed in the next drying step. In this step, the polyester resin with a high molecular weight dissolved evenly in the coating solution is precipitated in form of fine particles in the ultraviolet curable resin. After the coated film is dried, the ultraviolet curable resin is crosslinked and cured to form the curable resin cured layer by irradiating the plastic film with ultraviolet rays. In this curing step, the fine particles of the polyester resin with a high molecular weight are fixed in the hard coat layer and form projections in the surface of the curable resin cured layer to improve the surface roughness in a wide region. The solvent drying temperature is preferably up to a temperature almost the same as the glass transition temperature of the plastic film so as not to affect the heat shrinkage behavior of the plastic film.

The thickness of the curable resin cured layer is preferably in a range of 0.1 to 15 μm. It is more preferably in a range of 0.5 to 10 μm and even more preferably in a range of 1 to 8 μm. In the case the thickness of the curable resin cured layer is less than 0.1 μm, it becomes hard to form sufficient projections. On the other hand, if it exceeds 15 μm, it is not preferable in terms of productivity.

Furthermore, an inorganic layer may be formed on the curable resin cured layer. As the inorganic layer, for example, oxides and nitrides of silicon and aluminum can be exemplified.

EXAMPLES

Hereinafter, the invention will be described in more detail with reference to Examples; however, it is not intended that the invention be limited to the Examples. The various kinds of measurements and evaluations in Examples were carried out by the following methods.

(1) Total Light Transmittance

The total light transmittance was measured according to JIS-K7361-1 by using NDH 2000 manufactured by Nippon Denshoku Industries Co., Ltd.

(2) Surface Resistance Value

The surface resistance value was measured by a 4-terminal method according to JIS-K7194. The measurement apparatus used was Loresta MCP-T350 manufactured by Mitsubishi Chemical Analytech Co., Ltd.

(3) Method of Determining Crystallinity of Indium Oxide of Transparent Conductive Thin Film Each film specimen with a transparent conductive thin film layer formed was cut into a size of 1 mm×10 mm and stuck to an upper face of a proper resin block while the conductive thin film face being set outward. After the specimen was trimmed, an ultra-thin piece approximately parallel to the film surface was prepared by a general technical method of ultra microtome.

Each cut piece was observed with a transmission electronic microscope (JEM-2010, manufactured by JEOL Corp.) and a conductive thin film surface part with no significant scratch was selected and photographed with a direct magnification of 40000 times by accelerating voltage of 200 kV.

In the observation of the transparent conductive thin film layer with the transmission electronic microscope, those having polygonal regions were defined as crystalline indium oxide (crystal grains).

(4) Average of Circle-Equivalent Diameter and Coefficient of Variation of Circle-Equivalent Diameter of Crystal Grains of Indium Oxide of Transparent Conductive Thin Film and Long Diameter of Crystal Grains A value calculated by measuring an area of each of all of the crystal grains of indium oxide observed in the transparent conductive thin film layer by the transmission electron microscope, dividing the area by the circle constant π, and doubling a square root of the obtained value was defined as a circle-equivalent diameter: an average value of the obtained circle-equivalent diameter was defined as an average circle-equivalent diameter: and a value calculated by dividing the standard deviation of the circle-equivalent diameter by the average circle-equivalent diameter was defined as a coefficient of variation of the circle-equivalent diameter. Also, the longest parts of all of the crystal grains were measured and an average value of the measured values was defined as a long diameter of the crystal grains. Examples of the longest parts of the crystal grains are shown in FIGS. 2 to 5.

(5) Ratio of Amorphous Part to Crystalline Part of Transparent Conductive Thin Film The areas of all of the crystal grains of indium oxide in the transparent conductive thin film layer observed and photographed by the transmission electron microscope were measured; the difference between the observed and photographed area with the obtained areas of all of the crystal grains of indium oxide was defined as an amorphous part; and a ratio of the amorphous part to a crystalline part was calculated.

(6) Thickness of Transparent Conductive Thin Film (Film Thickness)

Each film specimen with a transparent conductive thin film layer formed was cut into a size of 1 mm×10 mm and embedded in an epoxy resin for an electron microscope. The resulting specimen was fixed in a specimen holder of an ultra microtome and a cross sectional thin piece approximately parallel to the shorter side of the embedded specimen was prepared. Next, a portion of the piece where no considerable scratch was observed was photographed with a transmission electron microscope (JEM-2010, manufactured by JEOL Corp.) at an accelerating voltage of 200 kV and an observation magnification of 10000 times in a bright field, and the film thickness was measured according to the obtained photograph.

(7) Measurement of Shrinkage Ratio of Transparent Conductive Film

According to JIS C2151, a size A of the of transparent conductive film before heat treatment and a size B of transparent conductive film after left in a thermostat bath kept at 120±3° C. for 60 minutes were measured by an image measurement apparatus (QS-L1020 Z/AF, manufactured by Mitutoyo Corporation) and the shrinkage ratio H was calculated according to the following formula.

$$H(\%)=(A-B)/A\times100$$

Sampling of each transparent conductive film was carried out in the machine direction and the traverse direction (20 mm×150 mm) and the shrinkage ratio $H_{MD}$ of the transparent conductive film in the machine direction at 120° C. for 60 minutes and the shrinkage ratio $H_{TD}$ of the transparent conductive film in the traverse direction at 120° C. for 60 minutes were measured.

A touch panel produced using the transparent conductive film of the invention was evaluated as follows.

(8) Pen Sliding Durability Test

A transparent conductive film was used as one panel plate, and as another panel plate, used was a transparent conductive thin film (S500, manufactured by Nippon Soda Co., Ltd.) containing indium tin composite oxide thin film (tin oxide content: 10% by mass) with a thickness of 20 nm and formed on a glass substrate by a plasma CVD method. These two panel plates (250 mm×190 mm) were arranged in such a manner that the transparent conductive thin films were set face to face via epoxy beads with a diameter of 30 μm to prepare a touch panel. Next, a load of 5.0 N was applied to a pen made of polyacetal (shape of tip end: 0.8 mmR) and a linear sliding test was carried out for the touch panel 300,000 times (150,000 round trips). Herein, the sliding distance was 30 mm and the sliding speed was 60 mm/s. After the sliding durability test, at first whether a sliding part was whitened or not was observed with eyes. Further, an ON resistance (resistance at the time of contacting a movable electrode (film electrode) with a fixed electrode) at the time of pressing the sliding part with a pen load of 0.5 N was measured. The ON resistance is desirable to be 10 kΩ or less.

(9) Flatness of Touch Panel

Light of a fluorescent lamp was reflected by the surface side of the transparent conductive film of each touch panel and observed with eyes. When the fluorescent lamp was reflected without strains by the surface side of the transparent conductive film at that time, "o" (good) was marked, and when the fluorescent lamp was reflected with strains, "x" (poor) was marked.

The transparent plastic film bases used in Examples 1 to 12 and Comparative Examples 1 to 6 were a biaxially-oriented transparent PET film having an easily adhesive layer in both faces (A4340, thickness 188 μm, manufactured by Toyobo Co., Ltd.). As a curable resin cured layer, a coating solution was prepared by mixing 3 parts by mass of a copolymer polyester resin (Vylon 200, weight average molecular weight 18,000, manufactured by Toyobo Co., Ltd.) with 100 parts by mass of an acrylic resin containing a photopolymerization initiator (Seikabeam EXF-01J, manufactured by Dainichiseika Color & Chemicals Mfg.), adding a mixed solvent of toluene/MEK (8/2: mass ratio) as a solvent in such an amount as to adjust the solid content concentration to be 50% by mass, and stirring and dissolving the resulting mixture evenly. The prepared coating solution was applied in a film thickness of 5 μm by a Meyer bar. After drying at 80° C. for 1 minute, it was irradiated with ultraviolet rays (light intensity: 300 mJ/cm$^2$) by using an ultraviolet radiation apparatus (UB042-5AM-W model, manufactured by Eye Graphics Co., Ltd.) to cure each coating film.

Examples 1 to 12

The above-mentioned film formation method was employed as a technique of obtaining a transparent conductive film.

The transparent conductive thin film formation conditions in those Examples are shown in Table 1. The production conditions in common for the respective Examples were as follows.

Each film was loaded to a vacuum chamber and the vacuum chamber was vacuum-evacuated to 2.0×10$^{-4}$. Next, oxygen was introduced to adjust the oxygen partial pressure to be 1.5×10$^{-2}$ and thereafter, argon as an inert gas was introduced to adjust the total pressure to 0.5 Pa. The introduced gases in the bombard step of Example 7 were the same as described above.

A transparent conductive thin film was formed by a DC magnetron sputtering method of applying an electric power at a power density of 1 W/cm$^2$ to a tin oxide-containing indium oxide sintered target or an indium oxide sintered target without tin oxide. The film thickness was controlled by changing the speed when the film passed above the target. The partial pressure ratio of a gas with a mass number of 28 to an inert gas in the film formation atmosphere at the time of sputtering was measured by using a gas analyzer (Transpector XPR 3, manufactured by INFICON).

After heated at 150° C. for 1 hour, each film on which the transparent conductive thin film was formed was subjected to the measurements described in Table 2. The measurement results are shown in Table 2.

Comparative Examples 1 to 6

The transparent conductive thin film formation conditions of these Comparative Examples are shown in Table 1 as same as those of Examples. The production conditions in common for respective Comparative Examples were also the same as those of Examples 1 to 12. Each film on which the transparent conductive thin film was formed was subjected to the measurements described in Table 2. The measurement results are shown in Table 2.

TABLE 1

|  | Position of cathod and anode (Note1: distance ratio) | Protect film | Knurl | Bombard step | Winding tension of film (N/m) | Heat-treatment of film before film formation |
|---|---|---|---|---|---|---|
| EXample 1 | 0.1 | None | None | None | 110 | None |
| EXample 2 | 10 | None | None | None | 110 | None |
| EXample 3 | 0.03 | Done | None | None | 110 | None |
| EXample 4 | 0.03 | None | Done | None | 110 | None |
| EXample 5 | 0.03 | None | None | None | 55 | None |
| EXample 6 | 0.03 | None | None | None | 95 | None |
| EXample 7 | 0.03 | None | None | Done (note 2) | 110 | None |
| EXample 8 | 0.03 | None | None | None | 110 | Done (note 3) |
| EXample 9 | 10 | None | None | None | 110 | None |
| Example 10 | 10 | None | None | None | 110 | None |
| EXample 11 | 10 | None | None | None | 110 | None |
| Example 12 | 10 | None | None | None | 110 | None |
| Comparative Example 1 | 0.05 | None | None | None | 110 | None |
| Comparative Example 2 | 0.03 | None | None | None | 105 | None |
| Comparative Example 3 | 10 | None | None | None | 110 | None |
| Comparative Example 4 | 10 | None | None | None | 110 | None |
| Comparative Example 5 | 10 | None | None | None | 110 | None |
| Comparative Example 6 | 10 | None | None | None | 110 | None |

(Note 1) A ratio of a distance between the film and an "anode closest to the film" to a distance between a cathode and the "anode closest to the film"
(note 2) RF suputtering was carried out at 0.5 W/cm$^2$ using SUS (stainless steel) as a target.
(note 3) Heating was carried out by IR heater with an output power of 200 W/m.

TABLE 2

|  | Partial pressure of a gas with a mass number of 28/Partial pressure of Ar gas | Tin oxide content (% by mass) | Film thickness (nm) | Total light transmittance (%) | Surface resistance ($\Omega/\square$) | Average of circle-equivalent diameter of crystal grains (nm) | Coefficient of variation of circle-equivalent diameter of crystal grains (—) | Pen sliding durability test |
|---|---|---|---|---|---|---|---|---|
| Example 1 | $4.8 \times 10^{-2}$ | 3 | 20 | 89 | 330 | 110 | 0.28 | Sliding part was transparent. ON resistance: 0.3 k$\Omega$ |
| Example 2 | $6.0 \times 10^{-4}$ | 3 | 20 | 89 | 330 | 80 | 0.16 | Sliding part was transparent. ON resistance: 0.2 k$\Omega$ |
| Example 3 | $3.0 \times 10^{-3}$ | 3 | 20 | 89 | 330 | 100 | 0.21 | Sliding part was transparent. ON resistance: 0.2 k$\Omega$ |
| Example 4 | $2.0 \times 10^{-3}$ | 3 | 20 | 89 | 330 | 100 | 0.20 | Sliding part was transparent. ON resistance: 0.2 k$\Omega$ |
| Example 5 | $7.0 \times 10^{-4}$ | 3 | 20 | 89 | 330 | 90 | 0.22 | Sliding part was transparent. ON resistance: 0.3 k$\Omega$ |
| Example 6 | $4.9 \times 10^{-2}$ | 3 | 20 | 89 | 330 | 130 | 0.22 | Sliding part was transparent. ON resistance: 0.4 k$\Omega$ |

TABLE 2-continued

|  | Partial pressure of a gas with a mass number of 28/Partial pressure of Ar gas | Tin oxide content (% by mass) | Film thickness (nm) | Total light transmittance (%) | Surface resistance (Ω/□) | Average of circle-equivalent diameter of crystal grains (nm) | Coefficient of variation of circle-equivalent diameter of crystal grains (—) | Pen sliding durability test |
|---|---|---|---|---|---|---|---|---|
| Example 7 | $4.0 \times 10^{-3}$ | 3 | 20 | 89 | 330 | 90 | 0.23 | Sliding part was transparent. ON resistance: 0.3 kΩ |
| Example 8 | $5.2 \times 10^{-4}$ | 3 | 20 | 89 | 330 | 100 | 0.24 | Sliding part was transparent. ON resistance: 0.3 kΩ |
| Example 9 | $7.0 \times 10^{-4}$ | 3 | 20 | 89 | 330 | 90 | 0.18 | Sliding part was transparent. ON resistance: 0.3 kΩ |
| Example 10 | $6.0 \times 10^{-4}$ | 0.5 | 20 | 71 | 600 | 35 | 0.17 | Sliding part was transparent. ON resistance: 0.2 kΩ |
| Example 11 | $6.0 \times 10^{-4}$ | 3 | 190 | 60 | 38 | 90 | 0.14 | Sliding part was transparent. ON resistance: 0.3 kΩ |
| Example 12 | $6.0 \times 10^{-4}$ | 2 | 20 | 89 | 400 | 35 | 0.17 | Sliding part was transparent. ON resistance: 0.3 kΩ |
| Comparative Example 1 | $5.1 \times 10^{-2}$ | 3 | 20 | 89 | 330 | 110 | 0.32 | Sliding part was whitened. ON resistance: 900 kΩ |
| Comparative Example 2 | $5.2 \times 10^{-2}$ | 3 | 20 | 89 | 330 | 130 | 0.37 | Sliding part was whitened. ON resistance: 896 kΩ |
| Comparative Example 3 | $6.0 \times 10^{-4}$ | 3 | 210 | 58 | 34 | 90 | 0.18 | Sliding part was transparent. ON resistance: 0.2 kΩ |
| Comparative Example 4 | $6.0 \times 10^{-4}$ | 3 | 8 | 92 | 700 | 110 | 0.45 | Sliding part was whitened. ON resistance: 897 kΩ |
| Comparative Example 5 | $6.0 \times 10^{-4}$ | 0 | 20 | 89 | 1500 | 1100 | 0.29 | Sliding part was transparent. ON resistance: 0.2 kΩ |
| Comparative Example 6 | $6.0 \times 10^{-4}$ | 10 | 20 | 89 | 350 | 25 | 0.34 | Sliding part was whitened. ON resistance: 897 kΩ |

As described in Table 2, the transparent conductive films of Examples 1 to 12 were found to be transparent in the sliding parts even after the pen sliding durability test and to have an ON resistance of 10 kΩ or less and very excellent pen sliding durability. Comparative Example 5 shown in the result of Table 2 was found to be excellent in pen sliding durability test, but to be inferior in other properties. Comparative Examples 1, 2, 4, and 6 were insufficient in the pen sliding durability. Comparative Example 5 was not suitable for use since the surface resistance was higher than a practically usable level.

The transparent plastic film bases used in Examples 13 to 28 and Comparative Examples 7 to 24 were a biaxially-oriented transparent PET film having an easily adhesive layer in both faces (A4340, thickness 188 μm, manufactured by Toyobo Co., Ltd.). As a curable resin cured layer, a coating solution was prepared by mixing 3 parts by mass of a copolymer polyester resin (Vylon 200, weight average molecular weight 18,000, manufactured by Toyobo Co., Ltd.) with 100 parts by mass of an acrylic resin containing a photopolymerization initiator (Seikabeam EXF-01J, manufactured by Dainichiseika Color & Chemicals Mfg.), adding a mixed solvent of toluene/MEK (8/2: mass ratio) as a solvent in such an amount as to adjust the solid content concentration to be 50% by mass, and stirring and dissolving the resulting mixture evenly (hereinafter, the coating solution is called as coating solution A). The prepared coating solution was applied in a film thickness of 5 μm by a Meyer bar. After drying at 80° C. for 1 minute, it was irradiated with ultraviolet rays (light intensity: 300 mJ/cm$^2$) by using an ultraviolet radiation apparatus (UB042-5AM-W model, manufactured by Eye Graphics Co., Ltd.) to cure each coating film.

Examples 13 to 26

The above-mentioned production method was employed as a technique of obtaining a transparent conductive film. These Examples were carried out under the conditions shown in Table 3 as follows.

Each film was loaded to a vacuum chamber and the vacuum chamber was vacuum-evacuated. Since the water partial pressure was decreased more during the film formation at the time of sputtering as the time of vacuum evacuation was longer, the partial pressure ratio of water to an inert gas in the film formation atmosphere at the time of sputtering was controlled by changing the vacuum evacuation time.

After oxygen introduction, argon as an inert gas was introduced to adjust the total pressure to 0.5 Pa.

A transparent conductive thin film was formed by a DC magnetron sputtering method of applying an electric power at a power density of 1 W/cm$^2$ to a tin oxide-containing indium oxide sintered target or an indium oxide sintered target without tin oxide. The film thickness was controlled by changing the speed when the film passed above the target. The partial pressure ratio of water to an inert gas in the film formation atmosphere at the time of sputtering was measured by using a gas analyzer (Transpector XPR 3, manufactured by INFICON Co., Ltd).

After heat treatment, each film on which the transparent conductive thin film was formed was subjected to the measurements described in Table 3 (however, some films were subjected to the measurements without heat treatment). The measurement results are shown in Table 3.

Example 27

After the reached vacuum degree was adjusted to be 5.0×10$^{-4}$ Pa, oxygen was introduced to be 4.0×10$^{-2}$ Pa, and then argon as an inert gas was introduced to adjust the total pressure to be 0.15 Pa. A transparent conductive thin film was formed by an ion plating method. The film formation condition was that indium oxide containing 5% by mass of tin oxide was used as a deposition material and arc discharge was carried out at a discharge voltage of 80 V, a Haas potential of +40 V, and a discharge electric current of 120 A to form a transparent conductive thin film with a thickness of 20 nm. The transparent conductive film was heated at 150° C. for 1 hour in an atmospheric pressure. After heat treatment, the surface resistance was 410Ω/□ and the total light transmittance was 89%. When observed by a transmittance electron microscope, the crystal grain diameter was 500 nm and the ratio of the amorphous part to the crystalline part was 0.33. The pen sliding part was transparent and the ON resistance was 0.4 kΩ.

Example 28

The coating solution A was mixed with 15% by mass of fine particles made of indium oxide containing 5% by mass of tin oxide and having a particle size of 30 nm, and the above-mentioned biaxially-oriented transparent PET film was coated with the prepared coating solution in a coating film thickness of 5 µm by a Meyer bar. After drying at 80° C. for 1 minute, it was irradiated with ultraviolet rays (light intensity: 300 mJ/cm2) by using an ultraviolet radiation apparatus (UB042-5AM-W model, manufactured by Eye Graphics Co., Ltd.) to cure the coating film and form a curable resin cured layer. The film on which the curable resin cured layer was formed was loaded to a vacuum chamber and the vacuum chamber was vacuum-evacuated to a reached vacuum degree of 5.0×10-4 Pa and thereafter, oxygen was introduced to be 5.0×10-3 Pa and then, argon as an inert gas was introduced to adjust the total pressure to 0.5 Pa. A transparent conductive thin film with a thickness of 20 nm was formed on the coat layer (the curable resin cured layer) side by a DC magnetron sputtering method of applying an electric power at a power density of 1 W/cm2 to an indium oxide sintered target containing 5% by mass of tin oxide. The transparent conductive film was heated at 150° C. for 1 hour in atmospheric pressure. After heat treatment, the surface resistance was 200Ω/□ and the total light transmittance was 89%. When observed by a transmittance electron microscope, the crystal grain diameter was 150 nm and the ratio of the amorphous part to the crystalline part was 0.35. The pen sliding part was transparent and the ON resistance was 0.4 kΩ.

Comparative Examples 7 to 22

Transparent conductive films were prepared and evaluated in the same manner as in Example 13 under the conditions shown in Table 4. The measurement results are shown in Table 4.

Comparative Example 23

The above-mentioned biaxially-oriented transparent PET film was coated with the coating solution A in a coating film thickness of 5 µm by a Meyer bar. After drying at 80° C. for 1 minute, it was irradiated with ultraviolet rays (light intensity: 300 mJ/cm$^2$) by using an ultraviolet radiation apparatus (UB042-5AM-W model, manufactured by Eye Graphics Co., Ltd.) to cure the coating film and form a curable resin cured layer. The film on which the curable resin cured layer was formed was loaded to a vacuum chamber and the vacuum chamber was vacuum-evacuated to a reached vacuum degree of 5.0×10$^{-4}$ Pa and thereafter, oxygen was introduced to be 5.0×10$^{-3}$ Pa and then, argon as an inert gas was introduced to adjust the total pressure to 0.5 Pa. A transparent conductive thin film with a thickness of 20 nm was formed on the coat layer side by a DC magnetron sputtering method of applying an electric power at a power density of 1 W/cm$^2$ to an indium oxide sintered target containing 5% by mass of tin oxide. The transparent conductive film was heated at 150° C. for 1 hour in atmospheric pressure. After heat treatment, the surface resistance was 205Ω/□ and the total light transmittance was 88%. When observed by a transmittance electron microscope, the crystal grain diameter was 100 nm and the ratio of the amorphous part to the crystalline part was 1.5. The pen sliding part was whitened and the ON resistance was 900 kΩ.

Comparative Example 24

The coating solution A was mixed with 15% by mass of fine particles made of indium oxide containing 5% by mass of tin oxide and having a particle size of 600 nm. The above-mentioned biaxially-oriented transparent PET film was coated with the prepared coating solution in a coating film thickness of 5 µm by a Meyer bar. After drying at 80° C. for 1 minute, it was irradiated with ultraviolet rays (light intensity: 300 mJ/cm$^2$) by using an ultraviolet radiation apparatus (UB042-5AM-W model, manufactured by Eye Graphics Co., Ltd.) to cure the coating film and form a curable resin cured layer. The film on which the curable resin cured layer was formed was loaded to a vacuum chamber and the vacuum chamber was vacuum-evacuated to a reached vacuum degree of 5.0×10$^{-4}$ Pa and thereafter, oxygen was introduced to be 5.0×10$^{-3}$ Pa and then, argon as an inert gas was introduced to adjust the total pressure to 0.5 Pa. A transparent conductive thin film with a thickness of 20 nm was formed on the coat layer side by a DC magnetron sputtering method of applying an electric power at a power density of 1 W/cm$^2$ to an indium oxide sintered target containing 5% by mass of tin oxide. The transparent conductive film was heated at 150° C. for 1 hour in atmospheric pressure. After heat treatment, the surface resistance was 195Ω/□ and the total light transmittance was 89%. When observed by a transmittance electron microscope, the crystal grain diameter was 1200 nm and the ratio of the amorphous part to the crystalline part was 0.25. The pen sliding part was whitened and the ON resistance was 900 kΩ.

TABLE 3

| | Water partial pressure/ Ar partial pressure | Oxygen partial pressure (Pa) | Tin oxide content (% by mass) | Film thickness (nm) | Heat treatment condition | Total light transmittance (%) | Surface resistance (Ω/□) | Crystal grain long diameter (nm) | Amorphous part/ crystalline part | Pen sliding durability test |
|---|---|---|---|---|---|---|---|---|---|---|
| Example 1 | $1.0 \times 10^{-3}$ | $1.2 \times 10^{-2}$ | 3 | 20 | None | 88 | 260 | 100 | 0.05 | Sliding part was transparent. ON resistance: 0.3 kΩ |
| Example 2 | $1.0 \times 10^{-3}$ | $1.6 \times 10^{-2}$ | 3 | 20 | None | 88 | 330 | 50 | 0.02 | Sliding part was transparent. ON resistance: 0.2 kΩ |
| Example 3 | $1.0 \times 10^{-3}$ | $1.2 \times 10^{-2}$ | 3 | 20 | 120° C., 1 hour | 89 | 300 | 250 | 0 | Sliding part was transparent. ON resistance: 0.2 kΩ |
| Example 4 | $1.0 \times 10^{-3}$ | $1.6 \times 10^{-2}$ | 3 | 20 | 120° C., 1 hour | 89 | 455 | 90 | 0 | Sliding part was transparent. ON resistance: 0.2 kΩ |
| Example 5 | $1.0 \times 10^{-3}$ | $1.2 \times 10^{-2}$ | 3 | 20 | 140° C., 1 hour | 89 | 320 | 300 | 0 | Sliding part was transparent. ON resistance: 0.3 kΩ |
| Example 6 | $9.0 \times 10^{-4}$ | $9.0 \times 10^{-3}$ | 3 | 20 | 135° C., 1 hour | 89 | 245 | 500 | 0.49 | Sliding part was transparent. ON resistance: 0.4 kΩ |
| Example 7 | $9.0 \times 10^{-4}$ | $9.0 \times 10^{-3}$ | 3 | 20 | 140° C., 1 hour | 89 | 255 | 600 | 0.43 | Sliding part was transparent. ON resistance: 0.3 kΩ |
| Example 8 | $9.0 \times 10^{-4}$ | $9.0 \times 10^{-3}$ | 0.5 | 20 | 150° C., 1 hour | 89 | 250 | 900 | 0.41 | Sliding part was transparent. ON resistance: 0.3 kΩ |
| Example 9 | $2.0 \times 10^{-3}$ | $2.0 \times 10^{-2}$ | 7 | 20 | 150° C., 1 hour | 89 | 460 | 80 | 0.01 | Sliding part was transparent. ON resistance: 0.3 kΩ |
| Example 10 | $1.0 \times 10^{-3}$ | $1.6 \times 10^{-2}$ | 3 | 90 | 120° C., 1 hour | 71 | 100 | 90 | 0 | Sliding part was transparent. ON resistance: 0.2 kΩ |
| Example 11 | $2.5 \times 10^{-3}$ | $2.5 \times 10^{-2}$ | 7 | 20 | 130° C., 1 hour | 89 | 800 | 60 | 0 | Sliding part was transparent. ON resistance: 0.3 kΩ |

TABLE 3-continued

|  | Water partial pressure/ Ar partial pressure | Oxygen partial pressure (Pa) | Tin oxide content (% by mass) | Film thickness (nm) | Heat treatment condition | Total light transmittance (%) | Surface resistance (Ω/□) | Crystal grain long diameter (nm) | Amorphous part/ crystalline part | Pen sliding durability test |
|---|---|---|---|---|---|---|---|---|---|---|
| Example 12 | $1.0 \times 10^{-3}$ | $2.8 \times 10^{-2}$ | 3 | 20 | 150° C., 1 hour | 89 | 900 | 40 | 0 | Sliding part was transparent. ON resistance: 0.3 kΩ |
| Example 13 | $2.8 \times 10^{-3}$ | $2.8 \times 10^{-2}$ | 3 | 20 | 150° C., 1 hour | 89 | 930 | 40 | 0.2 | Sliding part was transparent. ON resistance: 0.3 kΩ |
| Example 14 | $2.8 \times 10^{-3}$ | $9.0 \times 10^{-3}$ | 3 | 20 | 150° C., 1 hour | 89 | 260 | 90 | 0.48 | Sliding part was transparent. ON resistance: 0.3 kΩ |

TABLE 4

|  | Water partial pressure/ Ar partial pressure | Oxygen partial pressure (Pa) | Tin oxide content (% by mass) | Film thickness (nm) | Heat treatment condition | Total light transmittance (%) | Surface resistance (Ω/□) | Crystal grain long diameter (nm) | Amorphous part/ crystalline part | Pen sliding durability test |
|---|---|---|---|---|---|---|---|---|---|---|
| Comparative Example 7 | $1.0 \times 10^{-3}$ | $4.0 \times 10^{-3}$ | 3 | 20 | None | 88 | 230 | 0 | ∞ | Sliding part was whitened. ON resistance: 900 kΩ |
| Comparative Example 8 | $1.0 \times 10^{-3}$ | $4.0 \times 10^{-3}$ | 3 | 20 | 120° C., 1 hour | 88 | 200 | 50 | 19 | Sliding part was whitened. ON resistance: 896 kΩ |
| Comparative Example 9 | $1.0 \times 10^{-3}$ | $9.0 \times 10^{-3}$ | 10 | 20 | 150° C., 2 hours | 88 | 330 | 20 | 32 | Sliding part was whitened. ON resistance: 902 kΩ |
| Comparative Example 10 | $1.0 \times 10^{-3}$ | $9.0 \times 10^{-3}$ | 0 | 20 | 150° C., 1 hour | 86 | 1800 | 1500 | 0 | Sliding part was transparent. ON resistance: 0.3 kΩ |
| Comparative Example 11 | $1.2 \times 10^{-3}$ | $5.0 \times 10^{-3}$ | 3 | 20 | 140° C., 1 hour | 88 | 240 | 390 | 0.52 | Sliding part was whitened. ON resistance: 900 kΩ |
| Comparative Example 12 | $1.0 \times 10^{-3}$ | $4.0 \times 10^{-3}$ | 3 | 20 | 140° C., 1 hour | 88 | 190 | 430 | 1 | Sliding part was whitened. ON resistance: 900 kΩ |
| Comparative Example 13 | $2.0 \times 10^{-3}$ | $3.5 \times 10^{-2}$ | 3 | 20 | 130° C., 1 hour | 89 | 1250 | 50 | 0 | Sliding part was transparent. ON resistance: 0.2 kΩ |
| Comparative Example 14 | $1.0 \times 10^{-3}$ | $1.6 \times 10^{-2}$ | 3 | 10 | 120° C., 1 hour | 90 | 910 | 60 | 0.6 | Sliding part was whitened. ON resistance: 900 kΩ |
| Comparative Example 15 | $1.0 \times 10^{-3}$ | $1.6 \times 10^{-2}$ | 3 | 120 | 120° C., 1 hour | 66 | 74 | 90 | 0 | Sliding part was transparent. ON resistance: 0.2 kΩ |
| Comparative Example 16 | $3.5 \times 10^{-3}$ | $1.6 \times 10^{-2}$ | 3 | 20 | 120° C., 1 hour | 88 | 500 | 50 | 25 | Sliding part was whitened. ON resistance: 900 kΩ |
| Comparative Example 17 | $2.0 \times 10^{-4}$ | $9.0 \times 10^{-3}$ | 3 | 20 | 140° C., 1 hour | 88 | 250 | 600 | 0.44 | Sliding part was transparent. ON resistance: 0.4 kΩ |

TABLE 4-continued

| | Water partial pressure/ Ar partial pressure | Oxygen partial pressure (Pa) | Tin oxide content (% by mass) | Film thickness (nm) | Heat treatment condition | Total light transmittance (%) | Surface resistance (Ω/□) | Crystal grain long diameter (nm) | Amorphous part/ crystalline part | Pen sliding durability test |
|---|---|---|---|---|---|---|---|---|---|---|
| Comparative Example 18 | $1.0 \times 10^{-3}$ | $3.2 \times 10^{-2}$ | 3 | 20 | 140° C., 1 hour | 88 | 1100 | 55 | 0 | Sliding part was transparent. ON resistance: 0.4 kΩ |
| Comparative Example 19 | $2.8 \times 10^{-3}$ | $3.2 \times 10^{-2}$ | 3 | 20 | 140° C., 1 hour | 88 | 1200 | 50 | 0.4 | Sliding part was transparent. ON resistance: 0.4 kΩ |
| Comparative Example 20 | $3.2 \times 10^{-3}$ | $2.8 \times 10^{-3}$ | 3 | 20 | 140° C., 1 hour | 88 | 1000 | 50 | 0.6 | Sliding part was whitened. ON resistance: 895 kΩ |
| Comparative Example 21 | $3.2 \times 10^{-3}$ | $9.0 \times 10^{-3}$ | 3 | 20 | 140° C., 1 hour | 88 | 500 | 0 | ∞ | Sliding part was whitened. ON resistance: 903 kΩ |
| Comparative Example 22 | $2.8 \times 10^{-3}$ | $5.0 \times 10^{-3}$ | 3 | 20 | 140° C., 1 hour | 88 | 280 | 0 | ∞ | Sliding part was whitened. ON resistance: 907 kΩ |

* The Vacuume-evacuation time of Comparative Example 17 was longer than that of other Examples and Comparative Examples. The other Examples and Comparative Examples took 2 to 7 hours, however, Comparative Example 17 took 24 hours for vacuume-evacuation.

As described in Table 3, the transparent conductive films of Examples 13 to 26 and Examples 27 and 28 were found to be transparent in the sliding parts even after the pen sliding durability test and to have an ON resistance of 10 kΩ or less and very excellent pen sliding durability. The result of Comparative Example 10, shown in Table 4, was found to be excellent in pen sliding durability test, but to be inferior in other properties. Comparative Example 10 was not suitable for use since the surface resistance value was higher than a practically usable level. Comparative Example 9 was not suitable for use since the total light transmittance was lower than a practically usable level. The vacuum evacuation time was 2 to 7 hours in Examples 13 to 26, Comparative Examples 7 to 16, and Comparative Examples 20 to 22.

Examples 29 to 41

A biaxially-oriented transparent PET film having an easily adhesive layer in both faces (A4340, thickness 188 μm, manufactured by Toyobo Co., Ltd.) was used as a transparent plastic film base. As a curable resin cured layer, a coating solution was prepared by mixing 3 parts by mass of a copolymer polyester resin (Vylon 200, weight average molecular weight 18,000, manufactured by Toyobo Co., Ltd.) with 100 parts by mass of an acrylic resin containing a photopolymerization initiator (Seikabeam EXF-01J, manufactured by Dainichiseika Color & Chemicals Mfg.), adding a mixed solvent of toluene/MEK (8/2: mass ratio) as a solvent in such an amount as to adjust the solid content concentration to be 50% by mass, and stifling and dissolving the resulting mixture evenly. The prepared coating solution was applied to both faces of the biaxially-oriented transparent PET film in a film thickness of 5 μm by a Meyer bar. After drying at 70° C. for 1 minute, it was irradiated with ultraviolet rays (light intensity: 300 mJ/cm$^2$) by using an ultraviolet radiation apparatus (UB042-5AM-W model, manufactured by Eye Graphics Co., Ltd.) to cure each coated film.

The above-mentioned film formation method was employed as an technique of obtaining a transparent conductive film.

The transparent conductive thin film formation conditions in those Examples are shown in Table 5. The production conditions in common for the respective Examples were as follows.

Each film was loaded to a vacuum chamber and the vacuum chamber was vacuum-evacuated to $2.0 \times 10^{-4}$. Next, oxygen was introduced to adjust the oxygen partial pressure to be $1.5 \times 10^{-2}$ and thereafter, argon as an inert gas was introduced to adjust the total pressure to 0.5 Pa. The introduced gases in the bombard step of Example 35 were the same as described above.

A transparent conductive thin film was formed by a DC magnetron sputtering method of applying an electric power at a power density of 1 W/cm$^2$ to a tin oxide-containing indium oxide sintered target or an indium oxide sintered target without tin oxide. The film thickness was controlled by changing the speed when the film passed above the target. The partial pressure ratio of a gas with a mass number of 28 to an inert gas in the film formation atmosphere at the time of sputtering was measured by using a gas analyzer (Transpector XPR 3, manufactured by INFICON).

At first, the shrinkage ratio of each transparent conductive film produced in the above-mentioned method was measured.

Each transparent conductive film obtained in the above-mentioned manner was used for one panel plate, and as another panel plate, used was a transparent conductive glass obtained by forming a transparent conductive thin film (S500, manufactured by Nippon Soda Co., Ltd.) containing indium tin composite oxide thin film (tin oxide content: 10% by mass) with a thickness of 20 nm on a glass substrate by a plasma CVD method. These two panel plates (250 mm×190 mm) were arranged in such a manner that the transparent conductive thin films were set face to face via epoxy beads with a diameter of 30 μm and 4 sides of the panel plates were stuck to each other by using a double-faced tape (No. 500, manufactured by Nitto Denko Corporation) to produce a touch panel with a size of 12 inch. Thereafter, to improve the flatness, each touch panel was heated at 120° C. for 60 minutes.

The pen sliding durability test was carried out for the touch panel and the flatness of the touch panel was evaluated.

Further, the transparent conductive film was cut out from each touch panel, the average circle-equivalent diameter of crystal grains of indium oxide of each transparent conductive thin film, the ratio of the amorphous part to the crystalline part, the coefficient of variation of the average circle-equivalent diameter of crystal grains, the total light transmittance of the transparent conductive film, the surface resistance, and the thickness of the transparent conductive thin film were measured. The measurement results are shown in Table 6.

Example 42

A biaxially-oriented transparent PET film having an easily adhesive layer in both faces (A4340, thickness 188 μm, manufactured by Toyobo Co., Ltd.) was used as a transparent plastic film base, and a curable resin cured layer same as that of Example 29 was formed on only one face. Further, a transparent conductive thin film was formed on the curable resin cured layer in the same manner as in Example 29 to obtain a transparent conductive film. The evaluation and production of a touch panel were carried out in the same manner as in Example 29. The measurement results are shown in Table 7.

Example 43

A biaxially-oriented transparent PET film having an easily adhesive layer in both faces (A4340, thickness 188 μm, manufactured by Toyobo Co., Ltd.) was used as a transparent plastic film base, and a curable resin cured layer same as that of Example 29 was formed on only one face. Further, a transparent conductive thin film was formed on the face, where the curable resin cured layer was not formed, in the same manner as in Example 29 to obtain a transparent conductive film. The evaluation and production of a touch panel were carried out in the same manner as in Example 29. The measurement results are shown in Table 7.

Example 44

A biaxially-oriented transparent PET film having an easily adhesive layer in both faces (A4340, thickness 188 μm, manufactured by Toyobo Co., Ltd.) was used as a transparent plastic film base and no curable resin cured layer was formed. Further, a transparent conductive thin film was formed on one face of the PET film in the same manner as in Example 29 to obtain a transparent conductive film. The evaluation and production of a touch panel were carried out in the same manner as in Example 29. The measurement results are shown in Table 7.

Comparative Examples 25 to 33 and Reference Examples 1 to 2

A biaxially-oriented transparent PET film having an easily adhesive layer in both faces (A4340, thickness 188 μm, manufactured by Toyobo Co., Ltd.) was used as a transparent plastic film base and a curable resin cured layer same as that of Example 29 was formed on the both faces. The transparent conductive thin film formation conditions for these Comparative Examples were described in Table 5 as same as those for Examples. The production conditions in common for the respective Comparative Examples were also the same as those of Examples 29 to 41. Touch panels were produced in the same manner as in Examples, and evaluated. The measurement results are shown in Table 7.

Comparative Example 34

A transparent conductive film was produced in the same manner as in Comparative Example 33. Thereafter, in order to crystallize the transparent conductive film, heat treatment was carried out at 180° C. for 2 minutes. Thereafter, a touch panel was produced in the same manner as in Example 29, and evaluated. The measurement results are shown in Table 7.

TABLE 5

| | Position of cathod and anode (Note 1) | Protect film | Knurl | Bombard step | Winding tension of film (N/m) | Back roll temperature (° C.) | Partial pressure of a gas with a mass number of 28/Partial pressure of Ar gas |
|---|---|---|---|---|---|---|---|
| Example 29 | 0.1 | None | None | None | 110 | −10 | 4.8 × 10⁻² |
| Example 30 | 10 | None | None | None | 110 | −10 | 6.0 × 10⁻⁴ |
| Example 31 | 0.03 | Done | None | None | 110 | −10 | 3.0 × 10⁻³ |
| Example 32 | 0.03 | None | Done | None | 110 | −10 | 2.0 × 10⁻³ |
| Example 33 | 0.03 | None | None | None | 55 | −10 | 7.0 × 10⁻⁴ |
| Example 34 | 0.03 | None | None | None | 95 | −10 | 4.9 × 10⁻² |
| Example 35 | 0.03 | None | None | Done (note 2) | 110 | −10 | 4.0 × 10⁻³ |
| Example 36 | 10 | None | None | None | 110 | −10 | 6.0 × 10⁻⁴ |
| Example 37 | 10 | None | None | None | 110 | −10 | 6.0 × 10⁻⁴ |
| Example 38 | 10 | None | None | None | 110 | −10 | 6.0 × 10⁻⁴ |
| Example 39 | 10 | None | None | None | 110 | −10 | 6.0 × 10⁻⁴ |
| Example 40 | 10 | None | None | None | 110 | 25 | 6.0 × 10⁻⁴ |
| Example 41 | 10 | None | None | None | 110 | 60 | 6.0 × 10⁻⁴ |
| Example 42 | 0.1 | None | None | None | 110 | −10 | 4.8 × 10⁻² |
| Example 43 | 0.1 | None | None | None | 110 | −10 | 4.8 × 10⁻² |
| Example 44 | 0.1 | None | None | None | 110 | −10 | 4.8 × 10⁻² |
| Comparative Example 25 | 0.05 | None | None | None | 110 | −10 | 5.1 × 10⁻² |
| Comparative Example 26 | 0.03 | None | None | None | 105 | −10 | 5.2 × 10⁻² |
| Comparative Example 27 | 10 | None | None | None | 110 | −10 | 6.0 × 10⁻⁴ |
| Comparative Example 28 | 10 | None | None | None | 110 | −10 | 6.0 × 10⁻⁴ |
| Comparative Example 29 | 10 | None | None | None | 110 | −10 | 6.0 × 10⁻⁴ |

TABLE 5-continued

| | Position of cathod and anode (Note 1) | Protect film | Knurl | Bombard step | Winding tension of film (N/m) | Back roll temperature (°C.) | Partial pressure of a gas with a mass number of 28/Partial pressure of Ar gas |
|---|---|---|---|---|---|---|---|
| Comparative Example 30 | 10 | None | None | None | 110 | −10 | $6.0 \times 10^{-4}$ |
| Comparative Example 31 | 10 | None | None | None | 110 | 100 | $6.0 \times 10^{-4}$ |
| Comparative Example 32 | 10 | None | None | None | 110 | 130 | $6.0 \times 10^{-4}$ |
| Comparative Example 33 | 10 | None | None | None | 110 | −10 | $3.0 \times 10^{-4}$ |

(Note 1) A ratio of a distance between the film and an "anode closest to the film" to a distance between a cathode and 1
(note 2) RF suputtering was carried out at 0.5 W/cm2 using SUS (stainless steel) as a target.

TABLE 6

| | Tin oxide content (% by mass) | Film thick-ness (nm) | $H_{MD}$ (%) | $H_{TD}$ (%) | $|H_{MD} - H_{TD}|$ (%) | Total light transmittance (%) | Surface resistance ($\Omega/\square$) | Average of circle-equivalent diameter of crystal grains (nm) | Ratio of amorphous part to crystalline part | Coefficient of variation of circle-equivalent diameter of crystal grains (—) | Pen sliding durability test | Flatness of touch film |
|---|---|---|---|---|---|---|---|---|---|---|---|---|
| EXample 29 | 3 | 20 | 0.51 | 0.37 | 0.14 | 89 | 330 | 110 | 0.02 | 0.28 | Sliding part was transparent. ON resistance: 0.3 kΩ | ○ |
| EXample 30 | 3 | 20 | 0.51 | 0.37 | 0.14 | 89 | 330 | 80 | 0.01 | 0.16 | Sliding part was transparent. ON resistance: 0.2 kΩ | ○ |
| EXample 31 | 3 | 20 | 0.51 | 0.37 | 0.14 | 89 | 330 | 100 | 0.02 | 0.21 | Sliding part was transparent. ON resistance: 0.2 kΩ | ○ |
| EXample 32 | 3 | 20 | 0.51 | 0.37 | 0.14 | 89 | 330 | 100 | 0.02 | 0.20 | Sliding part was transparent. ON resistance: 0.2 kΩ | ○ |
| EXample 33 | 3 | 20 | 0.51 | 0.37 | 0.14 | 89 | 330 | 90 | 0.02 | 0.22 | Sliding part was transparent. ON resistance: 0.3 kΩ | ○ |
| EXample 34 | 3 | 20 | 0.51 | 0.37 | 0.14 | 89 | 330 | 130 | 0.02 | 0.22 | Sliding part was transparent. ON resistance: 0.4 kΩ | ○ |
| EXample 35 | 3 | 20 | 0.51 | 0.37 | 0.14 | 89 | 330 | 90 | 0.02 | 0.23 | Sliding part was transparent. ON resistance: 0.3 kΩ | ○ |
| EXample 36 | 0.5 | 20 | 0.51 | 0.37 | 0.14 | 71 | 600 | 35 | 0.02 | 0.17 | Sliding part was transparent. ON resistance: 0.2 kΩ | ○ |
| EXample 37 | 3 | 190 | 0.51 | 0.37 | 0.14 | 60 | 38 | 90 | 0.01 | 0.14 | Sliding part was transparent. ON resistance: 0.3 kΩ | ○ |
| EXample 38 | 2 | 20 | 0.51 | 0.37 | 0.14 | 89 | 400 | 35 | 0.02 | 0.17 | Sliding part was transparent. ON resistance: 0.3 kΩ | ○ |
| EXample 39 | 7 | 20 | 0.51 | 0.37 | 0.14 | 89 | 270 | 900 | 0.02 | 0.17 | Sliding part was transparent. ON resistance: 0.3 kΩ | ○ |
| EXample 40 | 3 | 20 | 0.45 | 0.28 | 0.17 | 89 | 330 | 90 | 0.01 | 0.14 | Sliding part was transparent. ON resistance: 0.3 kΩ | ○ |

TABLE 6-continued

| | Tin oxide content (% by mass) | Film thickness (nm) | $H_{MD}$ (%) | $H_{TD}$ (%) | $|H_{MD} - H_{TD}|$ (%) | Total light transmittance (%) | Surface resistance ($\Omega/\square$) | Average of circle-equivalent diameter of crystal grains (nm) | Ratio of amorphous part to crystalline part | Coefficient of variation of circle-equivalent diameter of crystal grains (—) | Pen sliding durability test | Flatness of touch film |
|---|---|---|---|---|---|---|---|---|---|---|---|---|
| EXample 41 | 3 | 20 | 0.40 | 0.15 | 0.25 | 89 | 330 | 70 | 0.01 | 0.12 | Sliding part was transparent. ON resistance: 0.3 k$\Omega$ | ○ |

TABLE 7

| | Tin oxide content (% by mass) | Film thickness (nm) | $H_{MD}$ (%) | $H_{TD}$ (%) | $|H_{MD} - H_{TD}|$ (%) | Total light transmittance (%) | Surface resistance ($\Omega/\square$) | Average of circle-equivalent diameter of crystal grains (nm) | Ratio of amorphous part to crystalline part | Coefficient of variation of circle-equivalent diameter of crystal grains (—) | Pen sliding durability test | Flatness of touch panel |
|---|---|---|---|---|---|---|---|---|---|---|---|---|
| Example 42 | 3 | 20 | 0.51 | 0.37 | 0.05 | 89 | 330 | 105 | 0.02 | 0.26 | Sliding part was transparent. ON resistance: 0.3 k$\Omega$ | ○ |
| Example 43 | 3 | 20 | 0.51 | 0.37 | 0.05 | 89 | 330 | 105 | 0.02 | 0.26 | Sliding part was transparent. ON resistance: 1.5 k$\Omega$ | ○ |
| Example 44 | 3 | 20 | 0.51 | 0.37 | 0.10 | 89 | 330 | 100 | 0.02 | 0.25 | Sliding part was transparent. ON resistance: 1.5 k$\Omega$ | ○ |
| Comparative Example 25 | 3 | 20 | 0.51 | 0.37 | 0.14 | 89 | 330 | 110 | 0.53 | 0.32 | Sliding part was whitened. ON resistance: 900 k$\Omega$ | ○ |
| Comparative Example 26 | 3 | 20 | 0.51 | 0.37 | 0.14 | 89 | 330 | 130 | 0.58 | 0.37 | Sliding part was whitened. ON resistance: 896 k$\Omega$ | ○ |
| Comparative Example 27 | 3 | 210 | 0.51 | 0.37 | 0.14 | 58 | 34 | 90 | 0.02 | 0.18 | Sliding part was transparent. ON resistance: 0.2 k$\Omega$ | ○ |
| Comparative Example 28 | 3 | 8 | 0.51 | 0.37 | 0.14 | 92 | 700 | 110 | 0.61 | 0.45 | Sliding part was whitened. ON resistance: 897 k$\Omega$ | ○ |
| Comparative Example 29 | 0 | 20 | 0.51 | 0.37 | 0.14 | 89 | 1500 | 1100 | 0.02 | 0.29 | Sliding part was transparent. ON resistance: 0.2 k$\Omega$ | ○ |
| Comparative Example 30 | 10 | 20 | 0.51 | 0.37 | 0.14 | 89 | 350 | 25 | 0.52 | 0.34 | Sliding part was whitened. ON resistance: 897 k$\Omega$ | ○ |
| Comparative Example 31 | 3 | 20 | 0.62 | 0.11 | 0.51 | 89 | 330 | 60 | 0.01 | 0.15 | Sliding part was transparent. ON resistance: 0.2 k$\Omega$ | X |
| Comparative Example 32 | 3 | 20 | 0.79 | 0.03 | 0.76 | 89 | 330 | 50 | 0.01 | 0.13 | Sliding part was transparent. ON resistance: 0.3 k$\Omega$ | X |
| Comparative Example 33 | 3 | 20 | 0.51 | 0.37 | 0.14 | 88 | 400 | — | 1 | — | Sliding part was whitened. ON resistance: 897 k$\Omega$ | ○ |

TABLE 7-continued

|  | Tin oxide content (% by mass) | Film thickness (nm) | $H_{MD}$ (%) | $H_{TD}$ (%) | $|H_{MD} - H_{TD}|$ (%) | Total light transmittance (%) | Surface resistance ($\Omega/\square$) | Average of circle-equivalent diameter of crystal grains (nm) | Ratio of amorphous part to crystalline part | Coefficient of variation of circle-equivalent diameter of crystal grains (—) | Pen sliding durability test | Flatness of touch panel |
|---|---|---|---|---|---|---|---|---|---|---|---|---|
| Comparative Example 34 | 3 | 20 | 0.05 | 0.02 | 0.03 | 89 | 250 | 40 | 0.01 | 0.13 | Sliding part was transparent. ON resistance: 0.2 k$\Omega$ | X |

As described in Tables 6 and 7, the transparent conductive films of Examples 29 to 44 had transparent sliding parts even after the pen sliding durability test, an ON resistance of 10 k$\Omega$ or less, and very excellent pen sliding durability. The flatness of the touch panels was also excellent. Comparative Examples 25, 26, 28, 30, and 33 were found to be whitened in the sliding parts after the pen sliding durability test, and to have an ON resistance of 10 k$\Omega$ or more and insufficient pen sliding durability. Comparative Examples 29, 32, and 34 and Reference Examples 1 and 2 were found to be excellent in the pen sliding durability test, but to be inferior in other properties. Reference Example 1 was not suitable for use since the total light transmittance was lower than the practically usable level. Comparative Example 29 was not suitable for use since the surface resistance was higher than the practically usable level. Comparative Examples 32 and 34 and Reference Example 2 were not sufficient in the flatness of the touch panels.

INDUSTRIAL APPLICABILITY

As described above, according to the present invention, a transparent conductive film having very excellent pen sliding durability can be produced by controlling an average particle diameter of crystal grains and a coefficient of variation when a transparent conductive film is formed on at least one face of a transparent plastic film base, and the transparent conductive film is extremely usable for application to a touch panel or the like for pen input. Further, the transparent conductive film has high heat shrinkage ratio, a touch panel excellent in flatness can be produced by heat shrinkage treatment at the time of use. Particularly, the transparent conductive film is extremely usable for application to a large scale touch panel.

EXPLANATION OF SYMBOLS

1: Distance between cathode and "anode closest to film"
2: Distance between film and "anode closest to film"
3: Film
4: Roll
5: Cover (anode closest to film)
6: Target containing mainly indium oxide and 0.5 to 8% by mass of tin oxide

The invention claimed is:

1. A transparent conductive film obtained by laminating a transparent conductive thin film containing crystalline indium oxide as a main component on at least one face of a transparent plastic film base, wherein an average circle-equivalent diameter of crystal grains of indium oxide of the transparent conductive thin film is 30 to 1000 nm and a coefficient of variation of a circle-equivalent diameter of the crystal grains is 0.00 to 0.30.

2. The transparent conductive of claim 1, wherein the transparent conductive thin film contains indium oxide as a main component and 0.5 to 8% by mass of tin oxide.

3. The transparent conductive film of claim 1, wherein a thickness of the transparent conductive thin film is 10 to 200 nm.

4. A touch panel using the transparent conductive film of claim 1 as a film in a movable electrode side.

5. A transparent conductive film obtained by laminating a transparent conductive thin film containing indium oxide as a main component on at least one face of a transparent plastic film base, wherein a shrinkage ratio of the transparent conductive film at 120° C. for 60 minutes in at least one direction is 0.20 to 0.70%, an average circle-equivalent diameter of crystal grains of indium oxide of the transparent conductive thin film after heat treatment at 120° C. for 60 minutes is 30 to 1000 nm, and a ratio of an amorphous part to a crystalline part of the transparent conductive thin film is 0.00 to 0.50.

6. The transparent conductive film of claim 5, wherein a shrinkage ratio HMD at 120° C. for 60 minutes in a machine direction of the transparent conductive film and a shrinkage ratio HTD at 120° C. for 60 minutes in a traverse direction of the transparent conductive film satisfy the formula (1):

$$0.00\% \leq |HMD - HTD| \leq 0.30\% \quad (1).$$

7. The transparent conductive film of claim 5, wherein a coefficient of variation of a circle-equivalent diameter of crystal grains of indium oxide of the transparent conductive thin film after heat treatment at 120° C. for 60 minutes is 0.00 to 0.30.

8. The transparent conductive film of claim 5, wherein the transparent conductive thin film contains indium oxide as a main component and 0.5 to 8% by mass of tin oxide.

9. The transparent conductive film of claim 5, wherein a thickness of the transparent conductive thin film is 10 to 200 nm.

10. A touch panel using the transparent conductive film of claim 5 as a film in a movable electrode side.

11. A transparent conductive film obtained by laminating a transparent conductive thin film containing indium oxide as a main component on at least one face of a base made of a laminated film obtained by forming a curable resin cured layer on at least one face of a transparent plastic film, wherein a shrinkage ratio of the transparent conductive film at 120° C. for 60 minutes in at least one direction is 0.20 to 0.70%, an average circle-equivalent diameter of crystal grains of indium oxide of the transparent conductive thin film after heat treatment at 120° C. for 60 minutes is 30 to 1000 nm, and a ratio of an amorphous part to a crystalline part of the transparent conductive thin film is 0.00 to 0.50.

12. The transparent conductive film of claim 11, wherein the curable resin is an ultraviolet-curable resin.

13. The transparent conductive film of claim 11, wherein the transparent conductive thin film contains indium oxide as a main component and 0.5 to 8% by mass of tin oxide.

14. The transparent conductive film of claim 11, wherein a thickness of the transparent conductive thin film is 10 to 200 nm.

15. A touch panel using the transparent conductive film of claim 11 as a film in a movable electrode side.

16. The transparent conductive film of claim 11, wherein a coefficient of variation of a circle-equivalent diameter of crystal grains of indium oxide of the transparent conductive thin film after heat treatment at 120° C. for 60 minutes is 0.00 to 0.30.

* * * * *

UNITED STATES PATENT AND TRADEMARK OFFICE
CERTIFICATE OF CORRECTION

PATENT NO. : 9,096,921 B2  
APPLICATION NO. : 13/121173  
DATED : August 4, 2015  
INVENTOR(S) : Tatami et al.

Page 1 of 1

It is certified that error appears in the above-identified patent and that said Letters Patent is hereby corrected as shown below:

On the title page item (75), line 1, under "Inventors:"

"Naka Tatami, Ohsu (JP)" should read "Naka Tatami, Ohtsu (JP)"

In the claims:

Claim 2 at column 36, line 19, "The transparent conductive of claim 1," should read "The transparent conductive film of claim 1,"

Signed and Sealed this  
Ninth Day of February, 2016

Michelle K. Lee  
*Director of the United States Patent and Trademark Office*